(12) United States Patent
Sakaue

(10) Patent No.: US 11,209,945 B2
(45) Date of Patent: *Dec. 28, 2021

(54) PRINTED WIRING

(71) Applicant: JAPAN AVIATION ELECTRONICS INDUSTRY, LIMITED, Tokyo (JP)

(72) Inventor: Akitoshi Sakaue, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/921,129

(22) Filed: Jul. 6, 2020

(65) Prior Publication Data
US 2020/0333919 A1 Oct. 22, 2020

Related U.S. Application Data

(63) Continuation of application No. 16/332,639, filed as application No. PCT/JP2017/032985 on Sep. 13, 2017, now Pat. No. 10,754,485.

(30) Foreign Application Priority Data

Oct. 13, 2016 (JP) .............................. JP2016-201536

(51) Int. Cl.
*H05K 3/12* (2006.01)
*G06F 3/044* (2006.01)
(Continued)

(52) U.S. Cl.
CPC .......... *G06F 3/0445* (2019.05); *G06F 3/0446* (2019.05); *G06F 3/04164* (2019.05);
(Continued)

(58) Field of Classification Search
CPC ....................................................... H05K 1/092
(Continued)

(56) References Cited

U.S. PATENT DOCUMENTS

| 10,754,485 B2* | 8/2020 | Sakaue | ................... B41M 1/34 |
| 2016/0202833 A1* | 7/2016 | Kim | ................... G06F 3/04164 |
| | | | 345/173 |
| 2016/0328070 A1 | 11/2016 | Lin et al. | |

FOREIGN PATENT DOCUMENTS

| CN | 104411502 A | 3/2015 |
| CN | 104808858 A | 7/2015 |

(Continued)

OTHER PUBLICATIONS

WO20140202862, Toppan printing co Ltd, Feb. 6, 2014, paragraphs 1-10 and 17-28 (Year: 2014).*

(Continued)

*Primary Examiner* — Stanley Tso
(74) *Attorney, Agent, or Firm* — Greenblum & Bernstein, P.L.C.

(57) ABSTRACT

In printed wiring that is formed, on a surface of a base member. by a film of cured electrically conductive ink and that includes: a wavy line; a first wiring element located at one side of both sides sandwiching the wavy line in a width direction; and a second wiring element located at the other side of the both sides and adjacently to the wavy line; a surplus wavy line is provided which is another wavy line, which extends along the wavy line adjacently to the wavy line between the wavy line and the first wiring element, and which is connected to the wavy line to have the same potential.

10 Claims, 12 Drawing Sheets

(51) Int. Cl.
*H05K 1/09* (2006.01)
*G06F 3/041* (2006.01)

(52) U.S. Cl.
CPC ............... *H05K 1/092* (2013.01); *H05K 3/12* (2013.01); *G06F 2203/04103* (2013.01); *G06F 2203/04112* (2013.01); *H05K 2201/09236* (2013.01); *H05K 2201/09245* (2013.01); *H05K 2201/09263* (2013.01)

(58) Field of Classification Search
USPC ........................................................ 174/250
See application file for complete search history.

(56) References Cited

FOREIGN PATENT DOCUMENTS

| CN | 105474142 A | | 4/2016 |
|---|---|---|---|
| JP | 2015-045890 A | | 3/2015 |
| JP | 2015-198108 | * | 11/2015 |
| JP | 2015-198108 A | | 11/2015 |
| JP | 2015198108 | * | 11/2015 |
| TW | 201406563 A | | 2/2014 |
| TW | 201508588 A | | 3/2015 |
| WO | 2014/020862 A1 | | 2/2014 |

OTHER PUBLICATIONS

Office Action issued in Japan family member Patent Appl. No. 2016-201536, dated Nov. 28, 2017, along with an English translation thereof.
Office Action issued in Japan family member Patent Appl. No. 2016-201536, dated Feb. 6, 2018, along with an English translation thereof.
Office Action issued in Taiwan family member Patent Appl. No. 106131147, dated Jun. 5, 2018, along with an English translation thereof.
International Search Report issued in WIPO family member Patent Appl. No. PCT/JP2014/032985, along with an English translation thereof.
Office Action issued in Korean family member Patent Appl. No. 10-2019-7007058, dated Jul. 30, 2020, along with an English translation thereof.
Office Action issued in China Counterpart Patent Appl. No. 201780052487.X, dated Aug. 2, 2021, along with an English translation thereof.

* cited by examiner

PRINTED WIRING

CROSS REFERENCE TO RELATED APPLICATIONS

The present application is a continuation application of U.S. patent application Ser. No. 16/332,639 filed Mar. 12, 2019, which is a National Phase application of International Application No. PCT/JP2017/032985, filed Sep. 13, 2017, which claims the benefit of Japanese Patent Application Number 2016-201536 filed Oct. 13, 2016, the disclosures of which are expressly incorporated herein by reference in their entireties.

TECHNICAL FIELD

The present invention relates to printed wiring in which wiring patterns are formed by printing.

BACKGROUND ART

Recently, printing methods, which are superior in terms of productivity and manufacturing costs, have been used for forming electrode patterns or wiring patterns for various types of electronic devices, such as touch panels, touch sensors, membrane switches, and organic electroluminescence devices. Among these methods, gravure offset printing has attracted attention due to its suitability for forming high-precision patterns.

Patent Literature 1 describes a case in which a touch sensor is formed by gravure offset printing. FIGS. 1 and 2 show a structure of a touch key having the touch sensor and a gravure offset printing machine used for manufacturing the touch sensor, which are described in Patent Literature 1.

As shown in FIG. 1, the touch key includes a touch sensor 10 and a touch-sensor driving circuit 15. The touch sensor 10 includes a substrate 11, net-like electrodes 12 formed on the substrate 11, outer-edge wiring lines 13 provided at outer edges of the net-like electrodes 12, and connection wiring lines 14 for connecting the outer-edge wiring lines 13 to the touch-sensor driving circuit 15. The net-like electrodes 12 are in the form of meshes. The outer-edge wiring lines 13 extend along the upper sides of the net-like electrodes 12 in FIG. 1.

The net-like electrodes 12, the outer-edge wiring lines 13, and the connection wiring lines 14 are printed on the substrate 11 at the same time by using the gravure offset printing machine and are then cured.

As shown in FIG. 2, a gravure offset printing machine 20 includes a plate table 21, a base-member table 22, a doctor blade 23, a transfer roller 24, a device frame 25, and a dispenser (not shown). An intaglio plate (gravure plate) 27, where intaglio patterns 26 having a net-like intaglio portions 26a, outer-edge intaglio portions 26b, and connection intaglio portions 26c corresponding respectively to the net-like electrodes 12, the outer-edge wiring lines 13, and the connection wiring lines 14 of the touch sensor 10 are formed, is placed on the plate table 21 and secured thereto. The substrate 11, which is a member on which printing is performed, is placed on the base-member table 22 and secured thereto. The doctor blade 23 and the transfer roller 24 are both movable along the X-axis and the Z-axis. The dispenser is also movable along the X-axis and the Z-axis.

While the dispenser supplies electrically conductive paste 28 on the intaglio plate 27, the doctor blade 23 is slid along the X-axis on the intaglio plate 27 to fill the intaglio patterns 26 on the intaglio plate 27 with the electrically conductive paste 28. The electrically conductive paste 28 that fills in the intaglio patterns 26 is received by the transfer roller 24, and the printing patterns held by the transfer roller 24 are transferred to the substrate 11. The printing patterns transferred to the substrate 11 are cured by heating, thus completing the net-like electrodes 12, the outer-edge wiring lines 13, and the connection wiring lines 14 of the touch sensor 10.

PRIOR ART LITERATURE

Patent Literature

Patent Literature 1: Japanese Patent Application Laid Open No. 2015-45890

SUMMARY OF THE INVENTION

Problems to be Solved by the Invention

As described above, Patent Literature 1 describes a case in which wiring patterns of a touch sensor are formed by gravure offset printing. In the wiring patterns shown in FIG. 1, because wiring elements through which the net-like electrodes 12, which are formed as thin-line meshes, are connected to the connection wiring lines 14 are the line-shaped outer-edge wiring lines 13 and the outer-edge intaglio portions 26b of the intaglio plate 27 corresponding to the outer-edge wiring lines 13 are parallel to the doctor blade 23, as shown in FIG. 2, the doctor blade 23 may fall into the outer-edge intaglio portions 26b during squeezing, thus scraping out electrically conductive paste (electrically conductive ink).

One structure that has been studied to avoid such an inconvenience is a structure in which wiring elements through which the net-like electrodes 12 are connected to the connection wiring lines 14 are not the line-shaped outer-edge wiring lines 13 but pads formed of thin-line meshes made up of line segments that obliquely intersect with the line direction of the edges (upper sides) of the net-like electrodes 12, that is, line segments that obliquely intersect with the direction in which the doctor blade 23 extends; and, in addition, portions of the connection wiring lines 14 that extend parallel to the direction in which the doctor blade 23 extends are modified to form wavy lines.

The problem of the ink being scraped out, caused by the fall of the doctor blade into the intaglio portions of the gravure plate, did not occur in a touch panel which has wiring patterns that included sensor electrode rows arranged in a sensor area, lead wiring lines for external connections, provided at a frame area surrounding the sensor area, and pads through which the sensor electrode rows were connected to the lead wiring lines, where the wiring patterns were formed by using gravure offset printing according to the foregoing study such that the sensor electrode rows were made up of first thin-line meshes, the pads were made up of second thin-line meshes that were denser than the first thin-line meshes, and further, portions of the lead wiring lines that extended parallel to the direction in which the doctor blade extended were wavy lines; however, a new problem was found in that characteristic large blurring caused by remaining ink occurred in the lead wiring line made up of a wavy line, positioned at downstream areas immediately after the wiring elements (pads, electrodes) made up of thin-line meshes in the squeezing direction. Since the lead wiring lines extending from the sensor electrode rows are placed close to each other in the frame area of the touch panel, such blurring would cause a severe defect of short circuiting of adjacent lead wiring lines.

An object of the present invention is to provide printed wiring that can prevent a short-circuit defect caused by such blurring.

Means to Solve the Problems

Printed wiring according to one aspect of the present invention is formed, on a surface of a base member, by a film of cured electrically conductive ink, and includes a wavy line, a first wiring element, a second wiring element, and a surplus wavy line disposed along the a wavy line. The first wiring element is located at one side of both sides in the width direction of the wavy line. The second wiring element is located at the other side of the both sides and adjacently to the wavy line. The surplus wavy line is located between the wavy line and the first wiring element and adjacently to the wavy line. The surplus wavy line is connected to the wavy line and has the same potential as the wavy line.

Printed wiring according to another aspect of the present invention is formed, on a surface of a base member, by a film of cured electrically conductive ink, and includes a wavy line, a first wiring element, a second wiring element, and a surplus wavy line disposed along the wavy line. The first wiring element is located at one side of both sides in the width direction of the wavy line. The second wiring element is located at the other side of the both sides and adjacently to the wavy line. The surplus wavy line is located between the wavy line and the first wiring element and adjacently to the wavy line. The surplus wavy line is insulated from the wavy line.

Effects of the Invention

According to the present invention, because a surplus wavy line is provided, even if characteristic blurring occurs at a wavy line downstream immediately after a first wiring element during squeezing when printed wiring is formed, for example, by gravure offset printing, such blurring only occurs at the surplus wavy line. Therefore, a short-circuit defect caused by blurring can be prevented from occurring, improving the yield.

DETAILED DESCRIPTION OF THE EMBODIMENTS

First, a structure of a capacitive touch panel will be described, which provided an opportunity for identifying the new problem in which the characteristic large blurring caused by the remaining ink occurs in the lead wiring line made up of the wavy line, positioned at downstream areas immediately after pads and sensor electrode rows made up of thin-line meshes in the squeezing direction.

Figure 1:
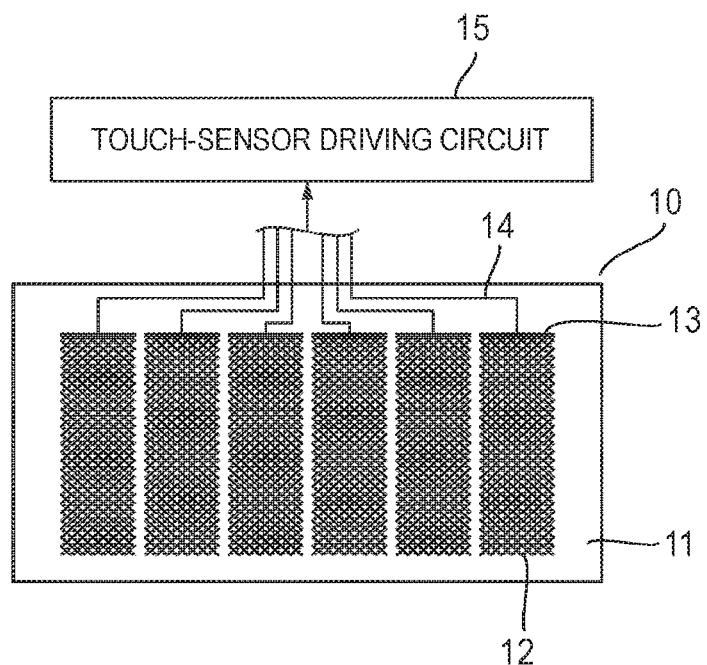
FIG. 1 is a view showing the configuration of a conventional example of a touch sensor.
Figure 2:
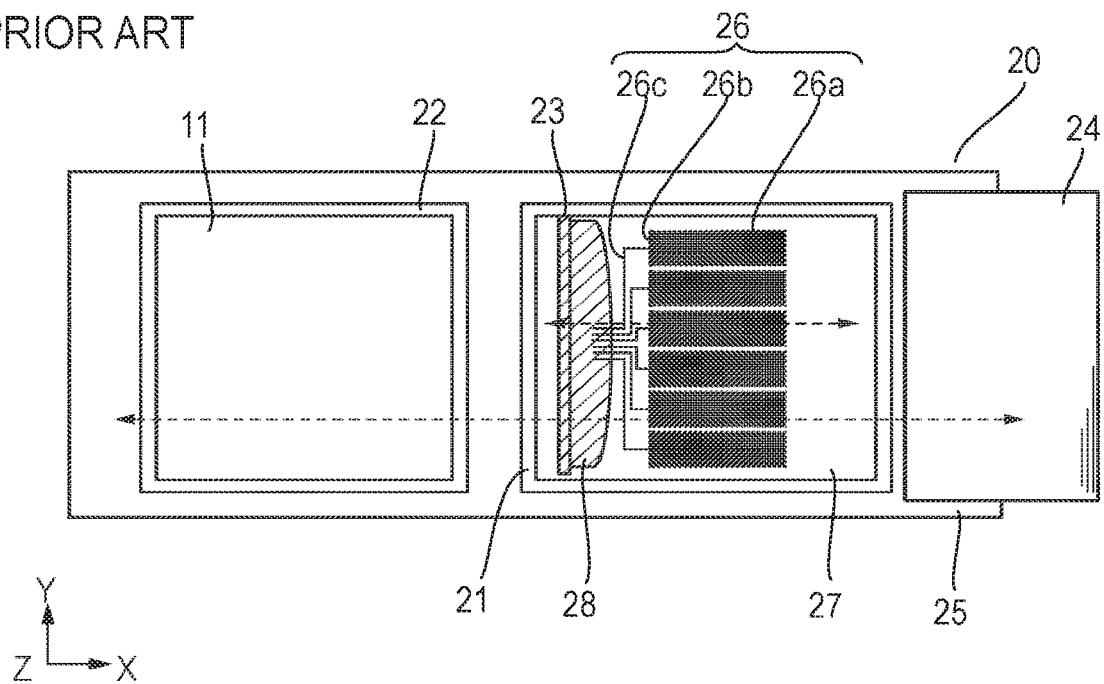
FIG. 2 is a view showing a gravure offset printing machine used to manufacture the touch sensor shown in FIG. 1.
Figure 3:
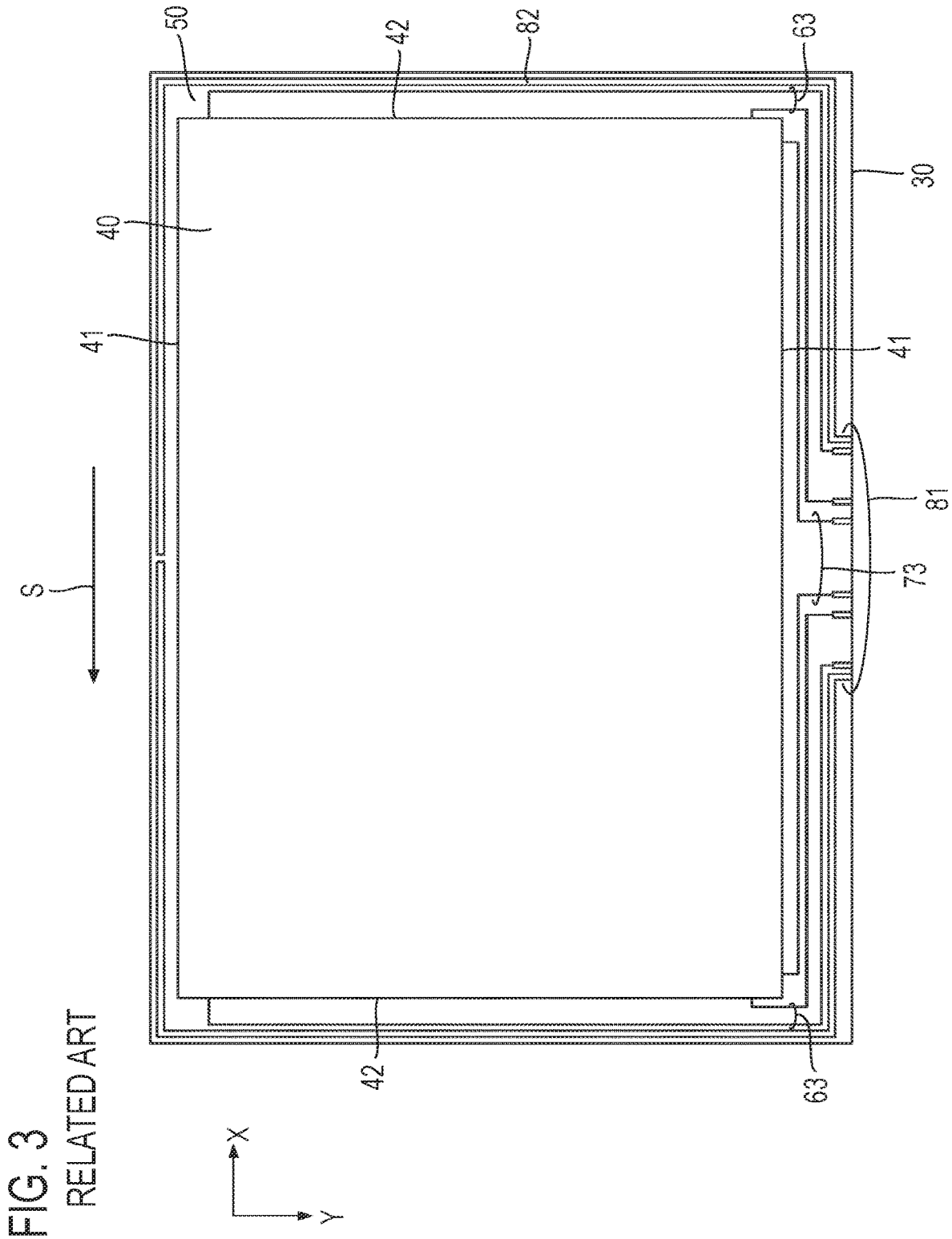
FIG. 3 is a view illustrating the outline of the structure of a touch panel.

FIG. 3 shows the outline of the structure of a capacitive touch panel. In FIG. 3, a transparent substrate is indicated by 30. The capacitive touch panel has a structure in which a first conductive layer, an insulating layer, a second conductive layer, and a protective layer, for example, are sequentially laminated on the transparent substrate 30.

Although not shown in detail in FIG. 3, sensor electrode rows includes first sensor electrode rows and second sensor electrode rows. The first sensor electrode rows are formed by the first conductive layer, and the second sensor electrode rows are formed by the second conductive layer, which is insulated from the first conductive layer by the insulating layer. In FIG. 3, an area surrounded by a rectangular frame indicates a sensor area 40 where the sensor electrode rows are positioned. The outside of the rectangular frame is a frame section 50 which surrounds the sensor area 40.

Figure 4:
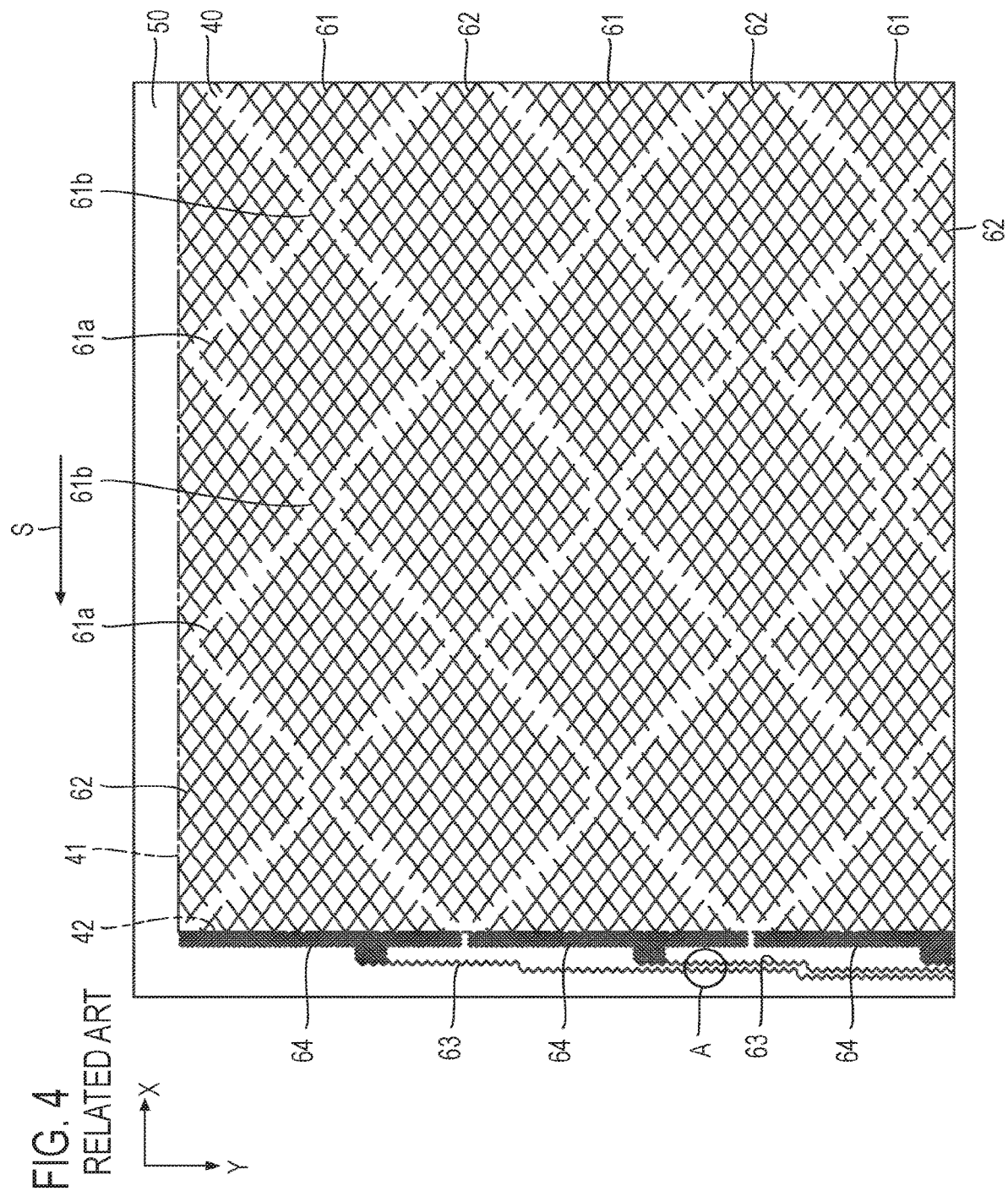
FIG. 4 is a partial enlarged view showing details of first sensor electrode rows, pads, and lead wiring lines of the touch panel shown in FIG. 3.
Figure 5:
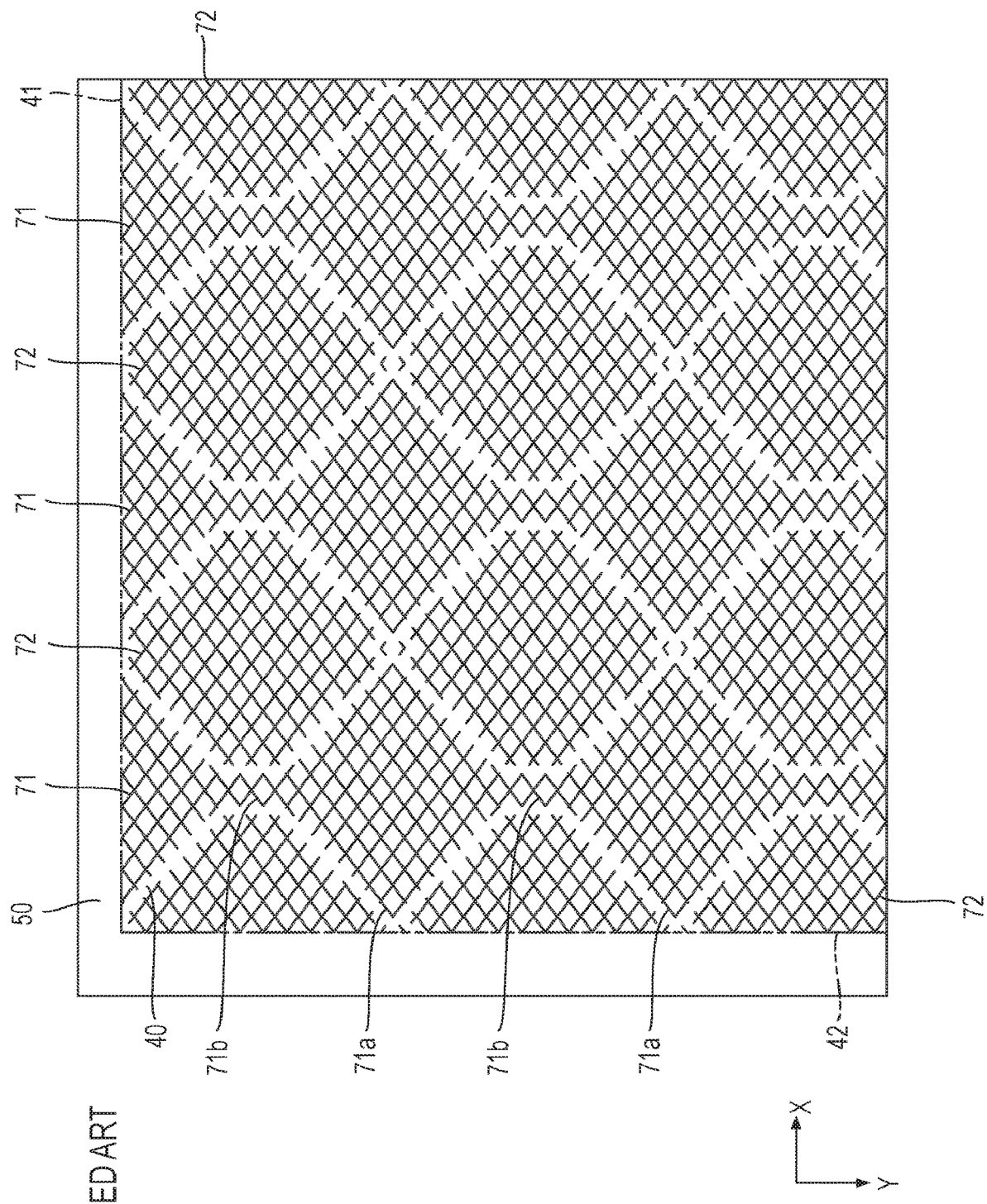
FIG. 5 is a partial enlarged view showing details of second sensor electrode rows of the touch panel shown in FIG. 3.

FIG. 4 shows details of first sensor electrode rows 61, dummy electrodes 62, lead wiring lines 63, and pads 64 all formed by the first conductive layer. FIG. 5 shows details of second sensor electrode rows 71 and dummy electrodes 72 all formed by the second conductive layer. FIGS. 4 and 5 show an upper left part of the sensor area 40 shown in FIG. 3, together with a part of the frame section 50.

In the sensor area 40, the first sensor electrode rows 61 are formed together with the dummy electrodes 62, as shown in FIG. 4, and the second sensor electrode rows 71 are formed together with the dummy electrodes 72, as shown in FIG. 5. The dummy electrodes 62 and 72 are formed so as to make the first sensor electrode rows 61 and the second sensor electrode rows 71 inconspicuous.

The first sensor electrode rows 61, the dummy electrodes 62, the second sensor electrode rows 71, and the dummy electrodes 72 are formed of thin-line meshes (first thin-line meshes) which have identical specifications and are made up of line segments obliquely intersecting with the sides of the sensor area 40 that is rectangular. Thin-line meshes were cut at predetermined portions to form the first sensor electrode rows 61, insulated from the dummy electrodes 62, and the second sensor electrode rows 71, insulated from the dummy electrodes 72. In this example, the unit lattice of the first thin-line meshes has a diamond shape one side of which is 400 μm long, and the line width of thin lines constituting the meshes is 7 μm. The first sensor electrode rows 61 and the dummy electrodes 62 are separated and insulated from each other by about 20 μm, as are the second sensor electrode rows 71 and the dummy electrodes 72.

The first sensor electrode rows 61 each include island-shaped electrodes 61a arranged along the X direction that is parallel to the long sides 41 of the rectangular sensor area 40, and connection sections 61b that connect adjacent island-shaped electrodes 61a. The first sensor electrode rows 61 are arranged in rows along the Y direction that is parallel to the short sides 42 of the rectangular sensor area 40. The second sensor electrode rows 71 each include island-shaped electrodes 71a arranged along the Y direction and connection sections 71b that connect adjacent island-shaped electrodes 71a. The second sensor electrode rows 71 are arranged in rows along the X direction.

The first sensor electrode rows 61 and the second sensor electrode rows 71 intersect with each other in an insulated state. The connection sections 61b and 71b are positioned at positions where the connection sections 61b and 71b overlap each other.

As shown in FIG. 3, lead wiring lines 63 and 73, terminals 81, and ground wiring lines 82 are formed in the frame section 50. Pads are also formed, which are not shown in FIG. 3. Each of the lead wiring lines 63 is drawn, through one of the pads 64 (see FIG. 4), from one of ends on both sides of the first sensor electrode rows 61 in the X direction. Each of the lead wiring lines 73 is drawn, through one of the pads, from one of ends on one side of the second sensor electrode rows 71 in the Y direction. In FIG. 3, among the lead wiring lines 63 and 73 provided for the frame section 50, only those positioned at both ends are shown whereas the others are not shown.

The terminals 81 are formed and arranged at a middle portion along one long side of the rectangular transparent substrate 30. The lead wiring lines 63 and 73 are extended to reach and connect to the terminals 81. The ground wiring lines 82 are formed at a peripheral part of the frame section 50 so as to surround the lead wiring lines 63 and 73. The ground wiring lines 82 are also connected to terminals 81.

The lead wiring lines 73 and the terminals 81 are formed by the first conductive layer in the same way as the lead wiring lines 63. The ground wiring lines 82 are formed by both the first and second conductive layers.

The pads 64, through which the first sensor electrode rows 61 are connected to the lead wiring lines 63, and the pads, not shown, through which the second sensor electrode rows 71 are connected to the lead wiring lines 73 are both formed of thin-line meshes (second thin-line meshes) made up of line segments obliquely intersecting with the long sides 41 and the short sides 42 of the sensor area 40. The second thin-line meshes are made to have a higher density than the first thin-line meshes that constitute the first and second sensor electrode rows 61 and 71. In this example, the unit lattice of the second thin-line meshes is a square having a side length of about 40 μm, and the line width of the thin lines constituting the meshes is 10 μm.

The terminals 81 and the ground wiring lines 82 are not shown in detail, but are formed of thin-line meshes having a higher density than the first thin-line meshes constituting the first and second sensor electrode rows 61 and 71, in the same way as the pads 64.

Figure 6:
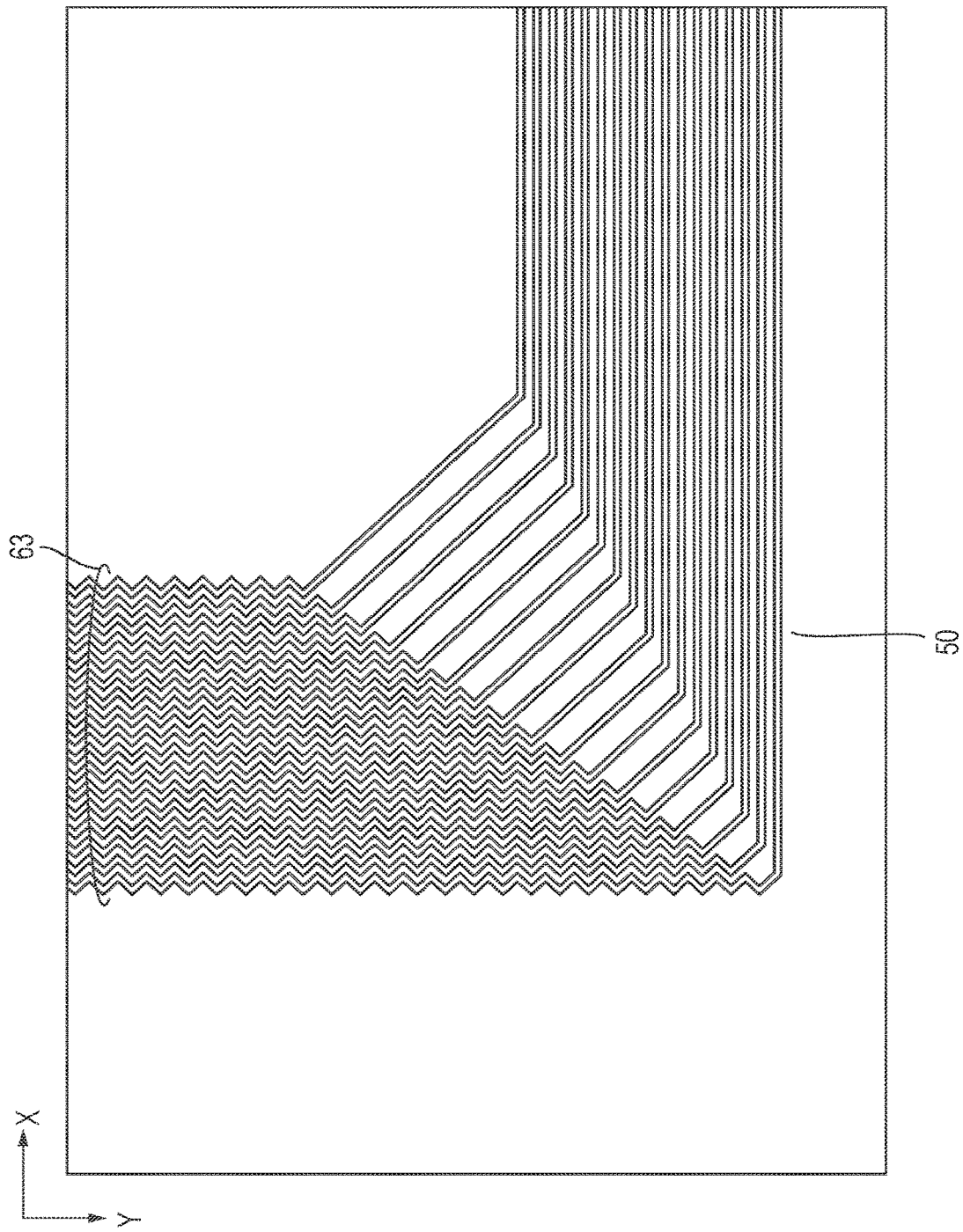
FIG. 6 is a partial enlarged view showing details of the lead wiring lines of the touch panel shown in FIG. 3.

On the other hand, the lead wiring lines 63 and 73 are not formed of meshes but formed of line-shaped wiring lines. In this example, portions of the lead wiring lines 63, which are drawn from the pads 64 and extend long in parallel to the sides 42 of the sensor area 40, that is, along the Y direction, are made to be wavy lines, as shown in FIG. 4. In a great number of lead wiring lines 63 arranged at a lower left part of the frame section 50 shown in FIG. 3, FIG. 6 shows portions where an extending direction changes from the Y direction to the X direction.

The first and second conductive layers, having the above-described structures, are formed in gravure offset printing by the use of electrically conductive ink that includes electrically conductive particles, such as silver particles. The squeezing direction S of the doctor blade with respect to the gravure plate that specifies the wiring patterns of the conductive layers is the X direction which is parallel to the long sides 41 of the sensor area 40, as shown by an arrow in FIG. 3.

As described above, in this example, the wiring patterns other than the lead wiring lines 63 and 73 are formed by thin-line meshes made up of line segments obliquely intersecting with the squeezing direction S of the doctor blade, and among the lead wiring lines 63 and 73, portions of the lead wiring lines 63, which extend long along the Y direction (the direction in which the edge of the doctor blade extends) are wavy lines, thus preventing the problem of the doctor blade falling into the intaglio portions of the gravure plate that specifies the wiring patterns and scraping out the electrically conductive ink.

On the other hand, as described before, the touch panel having such a structure exhibits a phenomenon whereby characteristic large blurring was caused by remaining ink in the lead wiring line 63 made up of a wavy line, positioned at downstream areas immediately after the pads 64 made up of thin-line meshes in the squeezing direction S.

Figure 7A:
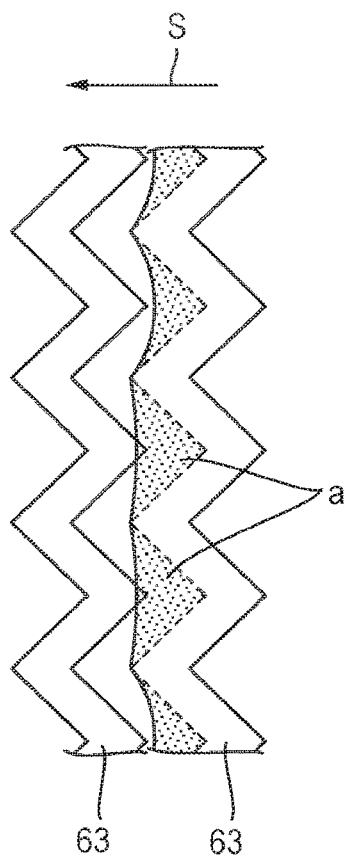
FIG. 7A is a view illustrating large blurring that occurs in a lead wiring line made up of a wavy line.

FIG. 7A is an enlarged view of part A in FIG. 4, which shows this blurring. In FIG. 7A, dotted portions indicate blurring a. Among two lead wiring lines 63, only one lead wiring line 63 positioned upstream in the squeezing direction S caused blurring a, but the other lead wiring line 63 positioned downstream did not cause blurring a. The blurring a caused the two adjacent lead wiring lines 63 to have a short circuit, as shown in FIG. 7A.

Characteristic blurring a like that shown in FIG. 7A has the following two characteristics.

(1) Blurring occurs only when a wiring element that causes a relatively large frictional resistance against the doctor blade is positioned relatively close upstream of the squeezing, with respect to the wavy line traversing the squeezing direction.

(2) Even when parallel wavy lines are provided downstream of a wiring element that causes a relatively large frictional resistance, blurring occurs only at one wavy line positioned on the most upstream side.

Here, "relatively close upstream of" is specified because it was observed that blurring a was not easy to occur when the distance between a wavy line and a wiring element positioned upstream was long, and it is inferred that blurring a would not occur if a sufficiently-wide, flat portion exists between the wavy line and the wiring element in the gravure plate.

On the basis of the fact that only the pads 64 and electrodes (the first sensor electrode rows 61 and the dummy electrodes 62) formed of thin-line meshes were wiring elements positioned upstream when such blurring a actually occurred, the inventor inferentially generalized the pads 64 and the electrodes formed of thin-line meshes to provide the definition of "a wiring element that causes a relatively large frictional resistance against the doctor blade".

It could be considered that, if dense unevenness that causes a relatively large frictional resistance against the doctor blade exists on the gravure plate, the edge of the doctor blade that passes the dense unevenness is lifted slightly from the surface of the gravure plate, causing this blurring a. However, the reason why only one wavy line located on the most upstream side causes this blurring a has not been found at this time.

When a wiring element such as a wavy line exists in the vicinity, downstream in the squeezing direction, of a wavy line that caused such blurring a, the wiring element and the wavy line cause short-circuiting, which causes a severe defect. This short-circuiting is indicated by two lead wiring lines 63 made up of wavy lines shown in FIG. 7A.

To avoid the occurrence of a short-circuiting defect caused by such blurring a, taking into consideration the above-described characteristics (1) and (2), another wavy line is provided as a surplus wavy line in the present embodiment, the surplus wavy line being adjacent to a wavy line and extends along the wavy line upstream in the squeezing direction of the wavy line, in other words, at the side where the first wiring elements are positioned, with respect to the wavy line sandwiched by first wiring elements that cause slight lifting (floating up) of the doctor blade and a second wiring element with which short-circuiting may occur. With this, blurring a may occur only at the surplus wavy line, and blurring a that causes a short-circuit with the second wiring element is prevented from occurring at the wavy line.

Figure 7B:
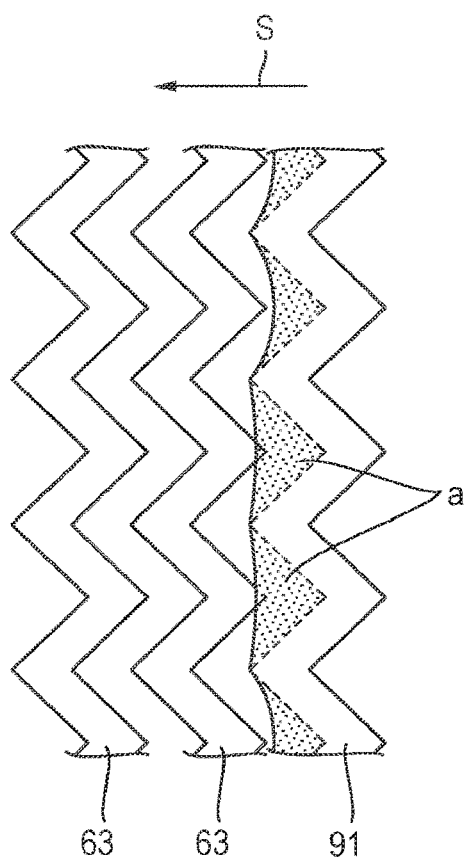
FIG. 7B is a view illustrating a structure that prevents a short-circuit defect caused by the blurring shown in FIG. 7A from occurring.

FIG. 7B shows a state in which a surplus wavy line 91 is provided, in contrast with the structure shown in FIG. 7A, and blurring a occurs at the surplus wavy line 91. It is assumed here that the surplus wavy line 91 does no cause any electrical problem even if blurring a causes a short-circuit between the surplus wavy line 91 and a lead wiring line 63.

Figure 8:
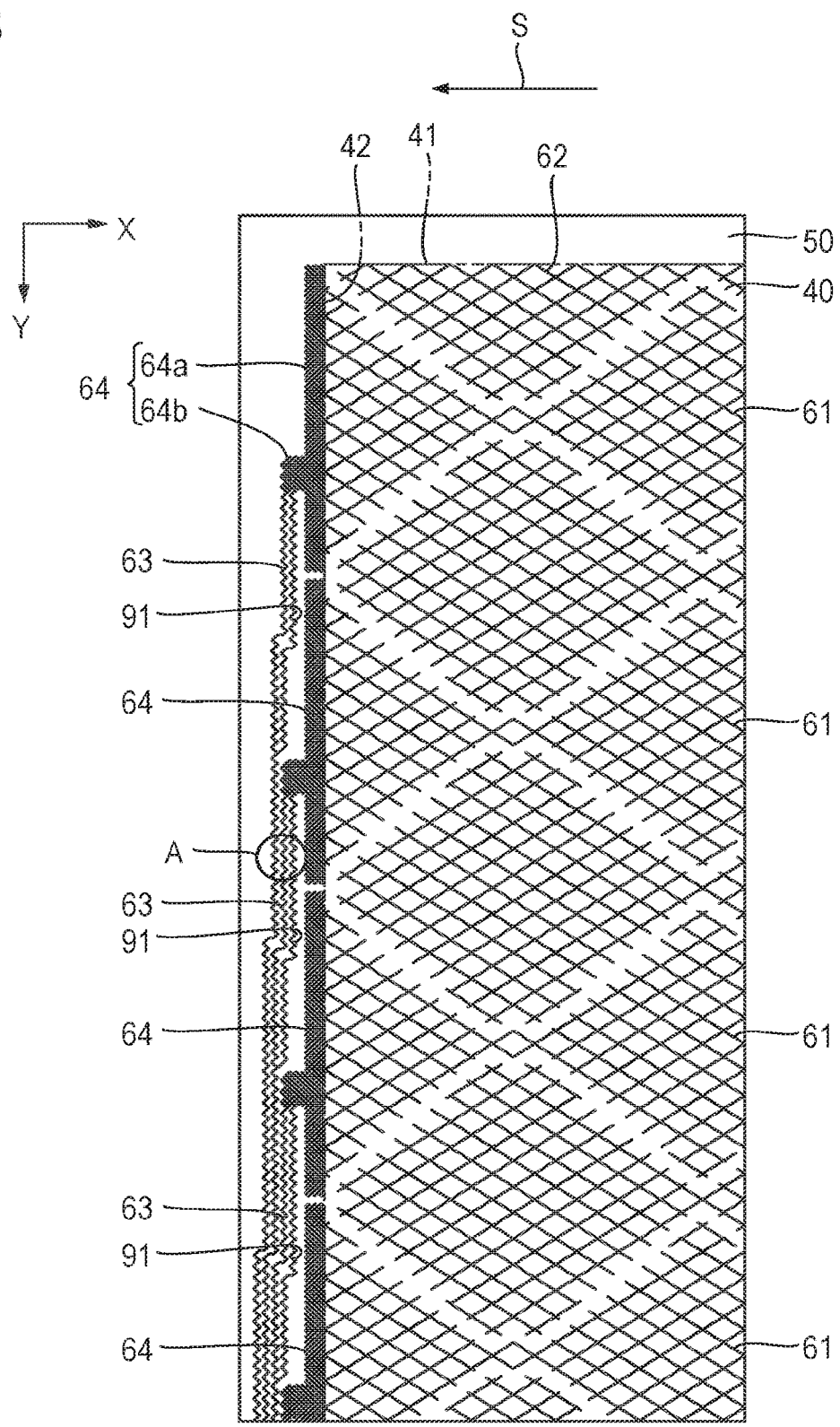
FIG. 8 is a partial enlarged view showing printed wiring according to a first embodiment.

FIG. 8 shows a specific structure in which surplus wavy lines 91 are provided for the touch panel described before. FIG. 7B corresponds to a portion A in FIG. 8.

Each pad 64 includes a straight part 64*a* that goes along with a side edge of the first sensor electrode row 61 and a protruding part 64*b* that protrudes from the straight part 64*a* in the outer-edge direction of the frame section 50 and that connects to the lead wiring line 63. In this example, as shown in FIG. 8, a surplus wavy line 91 extends along and adjacent to the lead wiring line 63 between the protruding sections 64*b* of the pad 64 and an adjacent pad 64, upstream of the lead wiring line 63 in the squeezing direction S.

In this example, each surplus wavy line 91 is connected to the protruding part 64*b* of the pad at one end (at the upper end) and is connected to the lead wiring line 63 at the other end. The surplus wavy line 91 is connected to the lead wiring line 63 in parallel.

Since the above-described structure is employed, characteristic blurring a may occur at the surplus wavy line 91. Even if the surplus wavy line 91 is short-circuited with the adjacent lead wiring line 63 due to blurring a, because the lead wiring line 63 is connected in parallel to and has the same potential as the surplus wavy line 91, no electrical problem occurs.

Since the lead wiring line 63 drawn from the uppermost pad 64 does not have any second wiring element with which a short-circuit may occur, there is no need to provide a surplus wavy line 91. If a detection circuit for a touch panel having no surplus wavy line 91 is used as a detection circuit for the present touch panel, since it is necessary to maintain differences among the resistance of a great number of lead wiring lines 63 (reason 1), a surplus wavy line 91 is provided for the uppermost pad 64.

In this example, as described before, each of the lead wiring lines 63 is drawn, through one of the pads 64, from one of ends on both sides of the first sensor electrode rows 61 in the X direction. Since the lead wiring lines 63 located at the opposite side in the X direction to that shown in FIG. 8 are positioned upstream of the pads 64 in the squeezing direction S, blurring a does not occur and no problem exists. However, it is desirable that the touch panel be symmetric in all electric characteristics such as resistance and capacitance (reason 2), and therefore, the same surplus wavy lines are provided symmetrically with respect to the lead wiring lines 63 located at the opposite side in the X direction (details are not shown).

Figure 9:
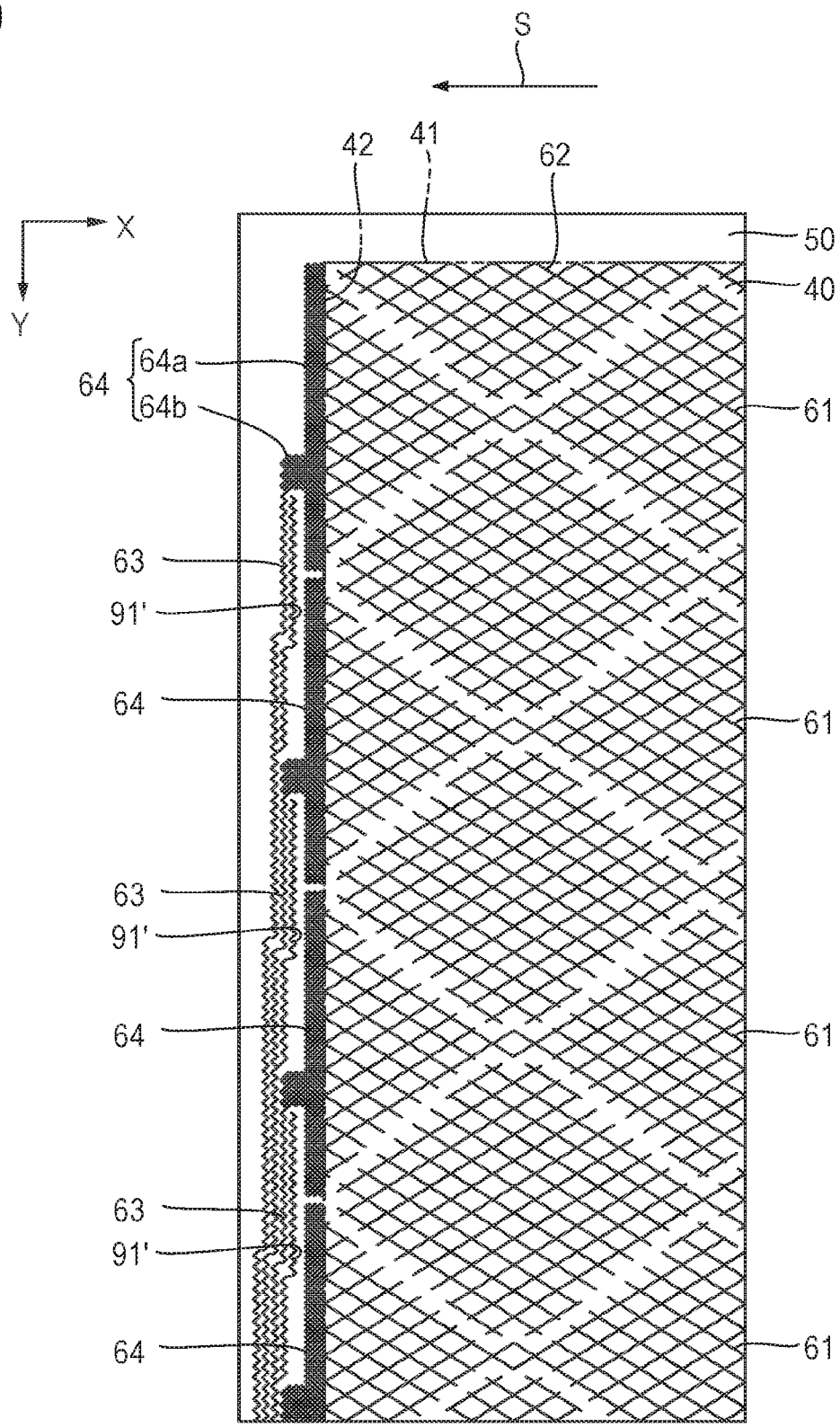
FIG. 9 is a partial enlarged view showing printed wiring according to a second embodiment.
Figure 10:
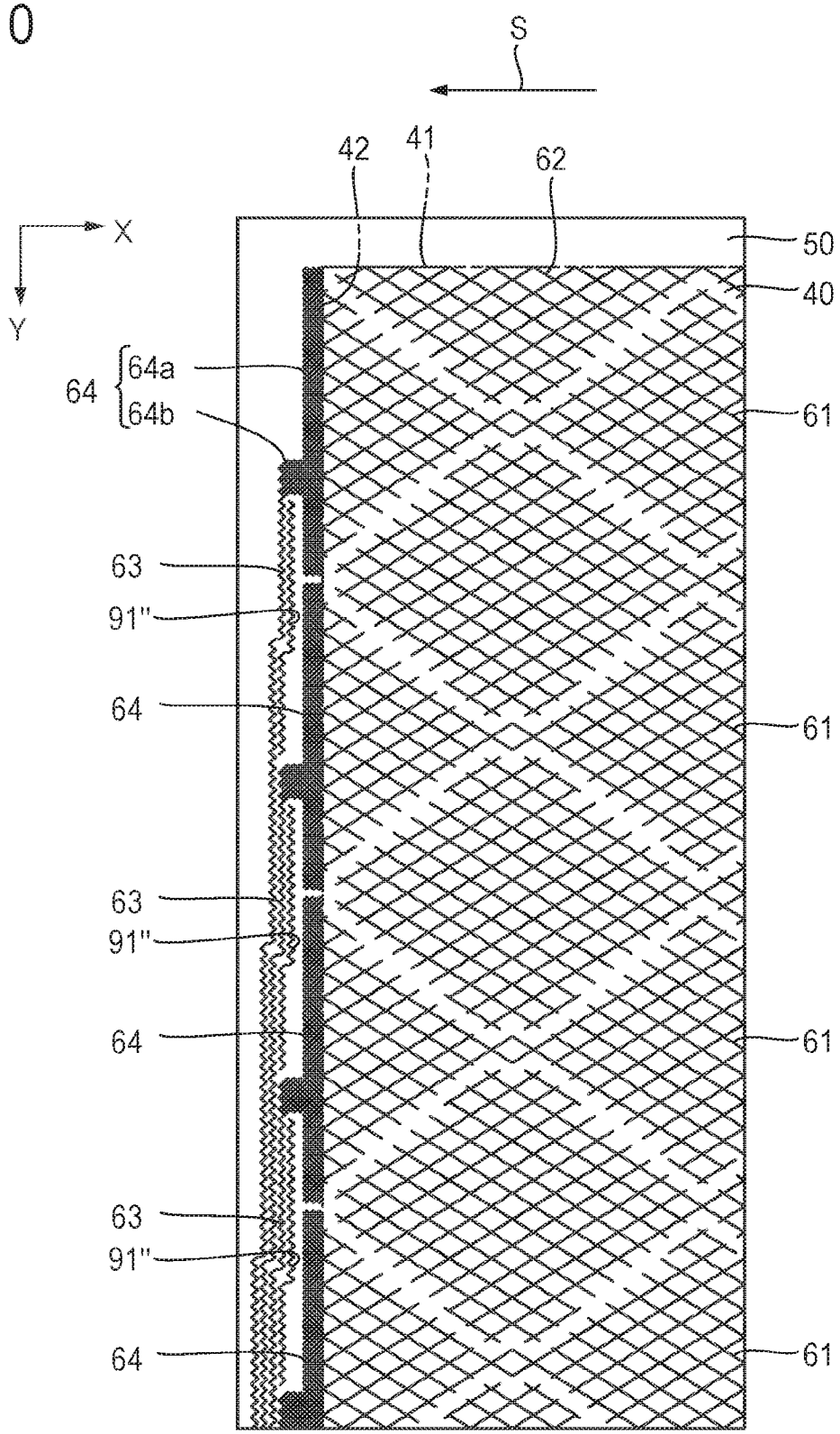
FIG. 10 is a partial enlarged view showing printed wiring according to a third embodiment.

In FIG. 8, the surplus wavy lines 91 are connected in parallel to the lead wiring lines 63. However, it is not necessarily required to have such a configuration. FIG. 9 and FIG. 10 show other configurations. In FIG. 9, unlike the surplus wavy lines 91 shown in FIG. 8, surplus wavy lines 91' are not connected to pads 64 at ends (upper ends) but are connected to the lead wiring lines 63 at the other ends. In FIG. 10, surplus wavy lines 91" are unconnected to the pads 64 and the lead wiring lines 63 at respective ends, being insulated from the lead wiring lines 63.

The surplus wavy lines can be those shown in FIG. 9 or FIG. 10. When the surplus wavy lines 91' shown in FIG. 9 or the surplus wavy lines 91" shown in FIG. 10 are used, it is not necessary to take into consideration the above-described reasons 1 and 2. Therefore, the surplus wavy line 91' or 91" provided for the lead wiring line 63 drawn from the uppermost pad 64 in FIG. 9 or FIG. 10 could be omitted. In addition, a surplus wavy line 91' or 91" may also be omitted for the lead wiring line 63 located at the other side in the X direction.

Printed wiring according to the present embodiment has been described above by using wiring patterns in the first conductive layer of the touch panel as an example. The present embodiment relates to printed wiring that is formed, on a surface of a base member, by a film of cured electrically conductive ink and that, at least, includes one wavy line; first wiring elements located at one of both sides sandwiching the wavy line in the width direction; and a second wiring element located at the other side of both sides and adjacently to the wavy line, and is characterized by providing one more wavy line (a surplus wavy line) that extends along the wavy line and adjacent to the wavy line between the wavy line and the first wiring elements.

Wiring elements here mean the structural elements of wiring made up of conductors, such as wiring lines, electrodes, pads, and portions thereof. In the structures of the touch panels shown in FIGS. 8 to 10, a pad 64 made up of highly dense thin-line meshes corresponds to the first wiring element; and, with respect to a lead wiring line 63 for which a surplus wavy line 91 (91' or 91") is adjacently provided, a lead wiring line 63 (another wavy line) located adjacent thereto and also located at the opposite side to the surplus wavy line 91 (91' or 91") corresponds to the second wiring element. Here, "adjacent to" means that another wiring element is not positioned therebetween.

Wavy-line shapes applied to wavy-line wiring patterns, such as the surplus wavy lines 91, which extend long in the Y direction of the lead wiring lines 63 (in the direction in which the edge of the doctor blade extends), will be described next.

Figure 11A:
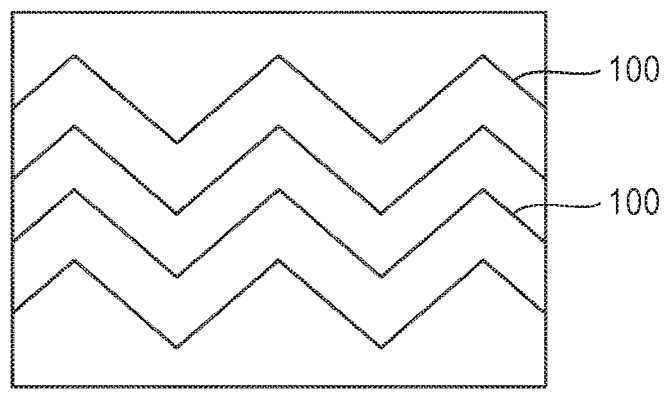
FIG. 11A is a view showing wiring patterns made up of wavy lines.

Wavy-line patterns 100 forming wavy lines shown in FIG. 11A are formed of triangular waves.

Figure 11B:
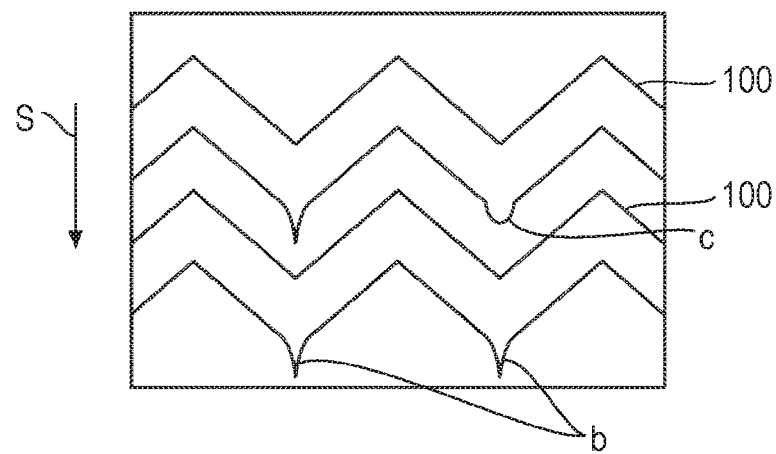
FIG. 11B is a view illustrating ink tailing and ink blurring.

When wavy lines of the wavy-line patterns forming wavy lines are formed of triangular waves, as shown in FIG. 11A, printed wiring patterns 100 tend to have problematic shapes as shown in FIG. 11B. Specifically, tailing of electrically conductive ink may occur at bending portions (zigzag portions) of the triangular waves located downstream in the squeezing direction S, as indicated by "b", and blurring of electrically conductive ink may occur at bending portions of the triangular waves, as indicated by "c".

If such tailing b or blurring c of the electrically conductive ink increases, the electrically conductive ink may contact an adjacent wiring pattern, causing a short-circuit defect. This prevents the arrangement pitch of wiring patterns from being made smaller.

Figure 12A:
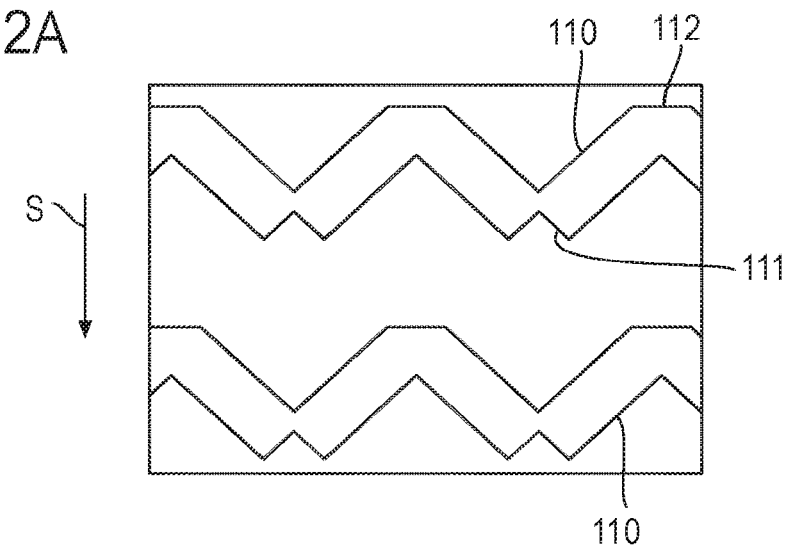
FIG. 12A is a view showing a wavy line shape of wiring patterns according to a first modification.
Figure 12B:
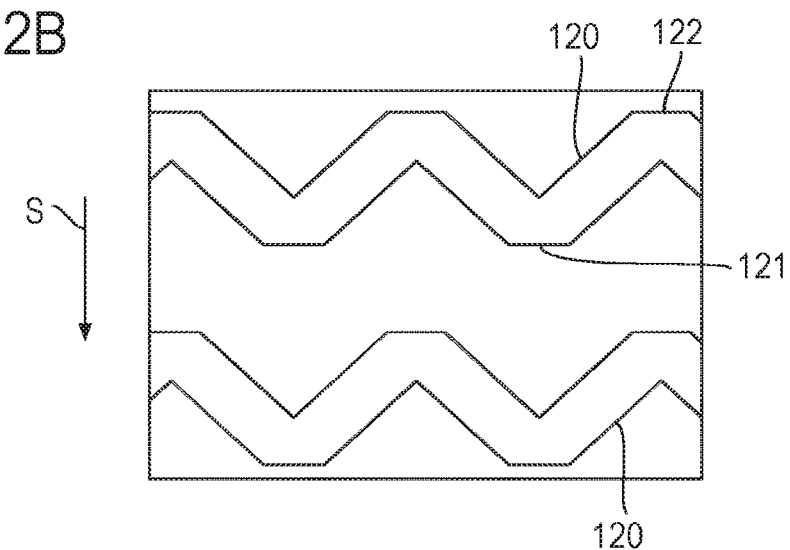
FIG. 12B is a view showing a wavy line shape of wiring patterns according to a second modification.
Figure 12C:
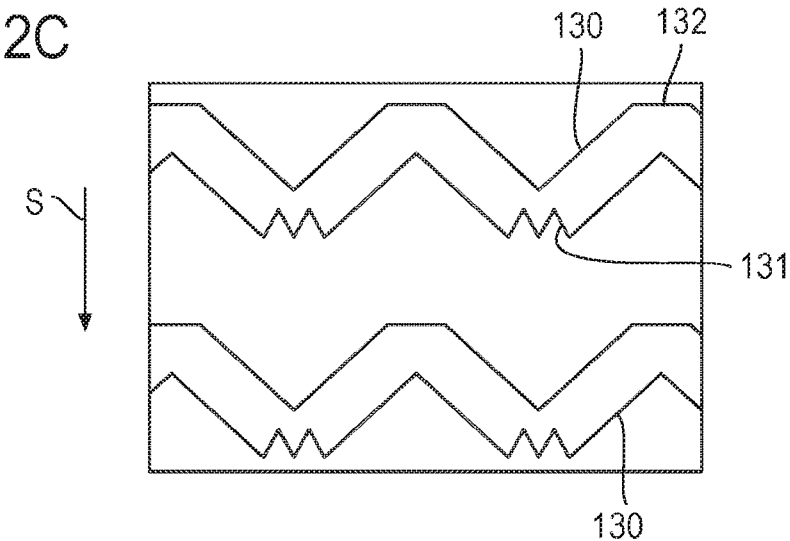
FIG. 12C is a view showing a wavy line shape of wiring patterns according to a third modification.

In the wavy lines forming wiring patterns 110, 120, and 130 shown in FIGS. 12A to 12C, the apexes of the bending portions of triangular waves, located downstream in the squeezing direction S and protruding in the direction perpendicular to the direction in which the triangular waves extend, are cut in order to reduce the degree of risk that the above-described tailing b or blurring c contacts an adjacent wiring pattern.

The wiring patterns 110 shown in FIG. 12A are cut at bending portions to form V-shaped notches 111. The wiring patterns 120 shown in FIG. 12B are cut straight at bending portions to form truncated portions 121. The wiring patterns 130 shown in FIG. 12C are cut at bending portions to form W-shaped notches 131. Providing such cut portions reduces the degree of risk of ink tailing b or blurring c contacting an adjacent wiring pattern, even if the tailing b or blurring c occurs, because the dimensions thereof are small, allowing the arrangement pitch of the wiring patterns to be made smaller. It is noted here that, in the wiring patterns 110, 120, and 130 shown in FIGS. 12A to 12C, the bending portions protruding in the opposite direction to those where the cut portions 111, 121, and 131 are formed are cut straight to form cut portions 112, 122, and 132.

Figure 13A:
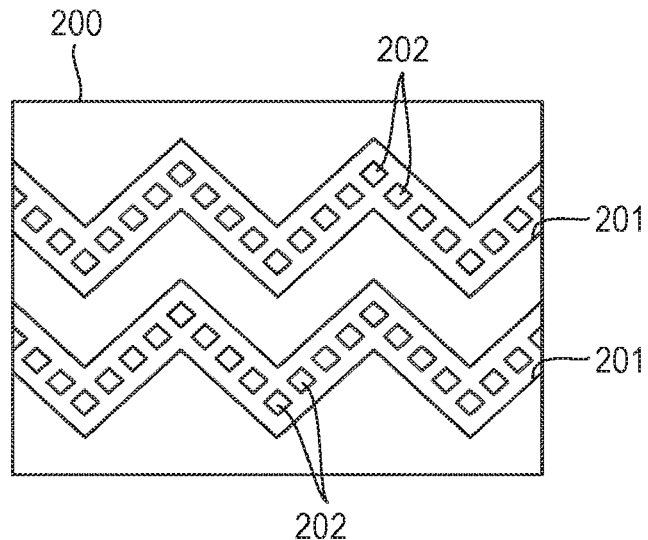
FIG. 13A is a view showing the configuration of an example of a gravure plate corresponding to wiring patterns made up of wavy lines.
Figure 13B:
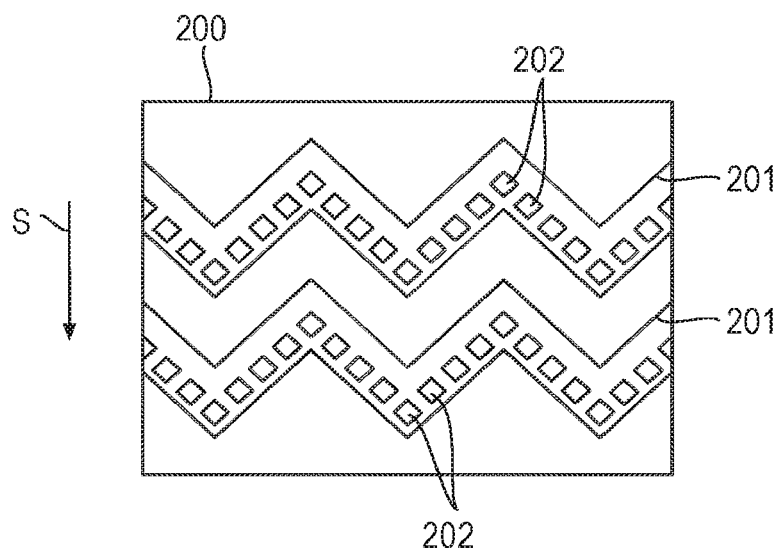
FIG. 13B is a view showing the configuration of another example of a gravure plate corresponding to wiring patterns made up of wavy lines.

To prevent such tailing b or blurring c, it is also effective to form relievo portions 202 at intaglio portions 201 in a gravure plate 200 corresponding to the wavy-line wiring patterns 100 to reduce the amount of electrically conductive ink used, as shown in FIG. 13A. With this, as a result, vacant spaces (spaces without film) or pits in the film, corresponding to the relievo portions 202 in the gravure plate 200, are formed in the wavy-line wiring patterns 100. It is preferred that the relievo portions 202 be formed at the bending portions of wavy lines. It is further preferred that the relievo portions 202 be formed with a shift in the squeezing direction S, as shown in FIG. 13B. One pit in the film or one space without film is formed in the width direction of the wavy-line shape and one or more thereof is formed in the longitudinal direction.

The line-shaped lead wiring lines 63 and 73 in the touch panels described before are made up of wiring lines thicker than the thin lines constituting thin-line meshes in order to reduce the resistance and to avoid wiring disconnection risk. Therefore, printing defects easily occur due to electrically conductive ink left on the blanket in gravure offset printing. Forming the relievo portions 202 at the intaglio portions 201 in the gravure plate 200 is preferred also for preventing such printing defects. In terms of this point, it is preferred that relievo portions be formed at intaglio portions in the gravure plate, corresponding not only to the wavy-line portions of the wiring patterns but also to the straight portions thereof.

What is claimed is:

1. A printed wiring formed on a surface of a base member by a film of cured electrically-conductive ink, the printed wiring comprising:
    a first wavy line;
    a first wiring element;
    a second wavy line disposed along the first wavy line, wherein:
        an apex of a bending portion included in the second wavy line has a flat configuration, the bending portion protruding in a width direction of the second wavy line, and the bending portion that has the flat configuration being located at at least one of both sides in the width direction of the second wavy line; and
        inside the second wavy line, one pit or one space is disposed in a width direction of a wavy-line shape and one or more pits or one or more spaces are disposed in a longitudinal direction of the wavy-line shape; and
    a surplus wavy line disposed along the first wavy line,
    the first wiring element being located at one side of both sides in a width direction of the first wavy line,
    the second wavy line being located at the other side of the both sides and adjacent to the first wavy line,
    wherein the surplus wavy line is:
        located between the first wavy line and the first wiring element, and adjacent to the first wavy line,
        separated by a distance from the first wiring element in the width direction of the first wavy line, and
        connected to the first wavy line and has a same potential as the first wavy line.

2. The printed wiring according to claim 1, wherein the first wiring element is an electrode made up of thin-line meshes or a wiring line made up of thin-line meshes.

3. The printed wiring according to claim 1, wherein an apex of a bending portion included in at least one of the first wavy line and the surplus wavy line has a flat configuration, the bending portion protruding in a width direction of the at least one of the first wavy line and the surplus wavy line, and the bending portion that has the flat configuration being located at at least one of both sides in the width direction of the at least one of the first wavy line and the surplus wavy line.

4. The printed wiring according to claim 1, wherein, inside at least one of the first wavy line and the surplus wavy line, one pit or one space is disposed in a width direction of a wavy-line shape and one or more pits or one or more spaces are disposed in a longitudinal direction of the wavy-line shape.

5. A printed wiring formed on a surface of a base member by a film of cured electrically-conductive ink, the printed wiring comprising:
    a first wavy line;
    a first wiring element;
    a second wavy line disposed along the first wavy line, wherein:
        an apex of a bending portion included in the second wavy line has a flat configuration, the bending portion protruding in a width direction of the second wavy line, and the bending portion that has the flat configuration being located at at least one of both sides in the width direction of the second wavy line; and inside the second wavy line, one pit or one space is disposed in a width direction of a wavy-line shape and one or more pits or one or more spaces are disposed in a longitudinal direction of the wavy-line shape; and a surplus wavy line disposed along the first wavy line, the first wiring element being located at one side of both sides in a width direction of the first wavy line, the second wavy line being located at the other side of the both sides and adjacent to the first wavy line, wherein the surplus wavy line is:
  located between the first wavy line and the first wiring element, and adjacent to the first wavy line,
  separated by a distance from the first wiring element in the width direction of the first wavy line, and
  insulated from the first wavy line.

6. The printed wiring according to claim 5, wherein the first wiring element is an electrode made up of thin-line meshes or a wiring line made up of thin-line meshes.

7. The printed wiring according to claim 5, wherein an apex of a bending portion included in at least one of the first wavy line and the surplus wavy line has a flat configuration, the bending portion protruding in a width direction of the at least one of the first wavy line and the surplus wavy line, and the bending portion-that has the flat configuration being located at at least one of both sides in the width direction of the at least one of the first wavy line and the surplus wavy line.

8. The printed wiring according to claim 5, wherein, inside at least one of the first wavy line and the surplus wavy line, one pit or one space is disposed in a width direction of a wavy-line shape and one or more pits or one or more spaces are disposed in a longitudinal direction of the wavy-line shape.

9. An electronic device comprising:
a base; and
a printed wiring provided on a surface of the base, the printed wiring being formed by a film of cured electrically-conductive ink, wherein the printed wiring comprises:
a first wavy line;
a first wiring element;
a second wavy line disposed along the first wavy line, wherein:
  an apex of a bending portion included in the second wavy line has a flat configuration, the bending portion protruding in a width direction of the second wavy line, and the bending portion that has the flat configuration being located at at least one of both sides in the width direction of the second wavy line; and
  inside the second wavy line, one pit or one space is disposed in a width direction of a wavy-line shape and one or more pits or one or more spaces are disposed in a longitudinal direction of the wavy-line shape; and a surplus wavy line disposed along the first wavy line, the first wiring element being located at one side of both sides in a width direction of the first wavy line, the second wavy line being located at the other side of the both sides and adjacent to the first wavy line, wherein the surplus wavy line is:
  located between the first wavy line and the first wiring element, and adjacent to the first wavy line,
  separated by a distance from the first wiring element in the width direction of the first wavy line, and
  connected to the first wavy line and has a same potential as the first wavy line.

10. An electronic device comprising:
a base; and
a printed wiring provided on a surface of the base, the printed wiring being formed by a film of cured electrically-conductive ink, wherein the printed wiring comprises:
a first wavy line;
a first wiring element;
a second wavy line disposed along the first wavy line, wherein:
  an apex of a bending portion included in the second wavy line has a flat configuration, the bending portion protruding in a width direction of the second wavy line, and the bending portion that has the flat configuration being located at at least one of both sides in the width direction of the second wavy line; and
  inside the second wavy line, one pit or one space is disposed in a width direction of a wavy-line shape and one or more pits or one or more spaces are disposed in a longitudinal direction of the wavy-line shape; and a surplus wavy line disposed along the first wavy line, the first wiring element being located at one side of both sides in a width direction of the first wavy line, the second wavy line being located at the other side of the both sides and adjacent to the first wavy line, wherein the surplus wavy line is:
  located between the first wavy line and the first wiring element, and adjacent to the first wavy line,
  separated by a distance from the first wiring element in the width direction of the first wavy line, and
  insulated from the first wavy line.

* * * * *